US006791240B2

(12) United States Patent
Mauchamp et al.

(10) Patent No.: US 6,791,240 B2
(45) Date of Patent: Sep. 14, 2004

(54) ULTRASONIC TRANSDUCER APPARATUS

(75) Inventors: Pascal Mauchamp, Fondettes (FR); Philippe Auclair, Tours (FR); Aimé Flesch, Andrésy (FR)

(73) Assignee: Vermon, Tours Cedex 1 (FR)

( * ) Notice: Subject to any disclaimer, the term of this patent is extended or adjusted under 35 U.S.C. 154(b) by 0 days.

(21) Appl. No.: 10/390,764

(22) Filed: Mar. 19, 2003

(65) Prior Publication Data

US 2003/0173867 A1 Sep. 18, 2003

Related U.S. Application Data

(62) Division of application No. 09/810,947, filed on Mar. 20, 2001, now Pat. No. 6,571,444.

(51) Int. Cl.[7] .......... H01L 41/08

(52) U.S. Cl. .......... 310/334; 600/459; 29/25.35

(58) Field of Search .......... 310/334; 600/459; 29/25.35

(56) References Cited

U.S. PATENT DOCUMENTS 5,025,790 A * 6/1991 Dias .......... 600/459
5,111,805 A * 5/1992 Jaggy et al. .......... 310/334
5,164,920 A * 11/1992 Bast et al. .......... 367/140
5,743,855 A * 4/1998 Hanafy et al. .......... 600/459
6,182,341 B1 * 2/2001 Talbot et al. .......... 29/25.35
6,224,556 B1 * 5/2001 Schwartz et al. .......... 600/447
6,338,394 B1 * 1/2002 Meynier .......... 310/328
6,467,138 B1 * 10/2002 Aime .......... 29/25.35
6,483,225 B1 * 11/2002 Spigelmyer .......... 310/313 R
6,571,444 B2 * 6/2003 Mauchamp et al. .......... 29/25.35

* cited by examiner

*Primary Examiner*—Thomas M. Dougherty
*Assistant Examiner*—J. Aguirrechea
(74) *Attorney, Agent, or Firm*—Stites & Harbison PLLC; Ross F. Hunt, Jr.

(57) ABSTRACT

An ultrasonic transducer particularly useful in medical imaging includes a transducer comprising a transducer body having a major front surface for radiating ultrasonic energy to a propagation medium responsive to mechanical vibration of the transducer. The transducer includes a piezoelectric member having a curved shape including a curved front surface. The curved shape is produced by deforming a planar piezoelectric composite member to produce the desired curvature and returning the curvature using suction forces. A graded frequency region is created by grinding the curved front surface of the piezoelectric element along a grinding plane. This region is defined by the area of intersection of the grinding plane and the front surface of the curved piezoelectric member and in different implementations, covers all or less than all of the total front surface.

8 Claims, 6 Drawing Sheets

ULTRASONIC TRANSDUCER APPARATUS

CROSS-REFERENCE TO RELATED APPLICATIONS

This application is a divisional of application Ser. No. 09/810,947 filed on Mar. 20, 2001 now U.S. Pat. No. 6,571,444.

BACKGROUND OF THE INVENTION

1. Field of the Invention

The present invention relates to ultrasonic transducers made from piezoelectric ceramic polymer composite materials, and, more particularly, to ultrasonic transducers made from a multi-frequency composite structure that broadens the transducer bandwidth, and to methods for making such transducers.

2. Background

In general, ultrasonic transducers are constructed by incorporating one or more piezoelectric vibrators which are electrically connected to pulsing-receiving system. Conventionally, the piezoelectric member is made up of a PZT ceramic, a single crystal, a piezo-polymer composite or piezoelectric polymer. The transducers are shaped in plate form (a single element transducer) or in bars (a slotted array transducer) and the parallel opposite major surfaces thereof (which extend perpendicularly to the propagation direction) have electrodes plated thereon to complete the construction. When the piezoelectric is subjected to mechanical vibration and electrically excited, acoustic waves are then transmitted to the propagation medium with a wavelength according to the thickness of the piezoelectric. Thus, the nominal frequency of an ultrasonic transducer is obtained by determining the dimension of piezoelectric in the direction of propagation. Based on these considerations, ultrasonic transducers exhibit a unique nominal frequency that corresponds to the thickness resonance mode and thus the bandwidth of such transducers is inherently limited or bounded. A common task facing transducer designers is the optimization of the efficiency of, or otherwise improving, the electromechanical coefficient of the transducer which determines the quality of the transducer device. The most common technique of producing piezo-ceramic based ultrasonic transducers involves the provision of a backwardly damping member or backing member and/or an impedance matching layer at the transducer front face. In the first case, the sensitivity of the transducer decreases proportionally to the increase in the backing impedance, and, therefore, according to the bandwidth provided, while an improvement in both sensitivity and bandwidth can be provided by the use of a matching layer.

In practice, ultrasonic transducers are based on a judicious compromise with respect to the ratio of gain-bandwidth, and thus commonly use a medium impedance backing associated with a single or a double matching layer to achieve satisfactory performance. The set of double matching layers is composed of a first layer attached to the front surface of the piezoelectric and having an acoustic impedance between that of piezoelectric and the second matching layer, a second layer attached to the external face of the first layer and having impedance lower than that of the propagation medium. In this way, a gradient of acoustic impedances is obtained between the piezoelectric and the propagation medium, and the impedance value of each component is calculated based on a polynomial function to minimize reflection at the various interfaces.

Although the optimization techniques described above will enable transducer to provide a fractional bandwidth up to 70–80%, because of the compromise that must be accepted, the transducer sensitivity may decrease dramatically (with a heavy backing) or the fabrication of transducer may be complicated (e.g., with more than two matching layers). During the past decade, such bandwidth (i.e., a bandwidth on the order of 70%) provides acceptable performance when using standard medical diagnostic equipment or systems equipped with low dynamic range image processors. However, with the introduction of harmonic imaging techniques and full digital imaging mainframes, modern systems can now accept, and even require, an extended bandwidth scan-head to take advantage of the potential of these new technologies.

To provide the market with improved transducer products, manufacturers have made a number of new developments. One of these concerns the use of high mechanical loss piezoelectric material such as a polymer or ceramic-polymer composite. The particular structure of these materials allow increased damping of the transducer so that the impulse response is enhanced. The gain in bandwidth is about 5 to 10% with a composite and more with piezoelectric polymer but in the latter case, this increase in bandwidth is associated with a dramatic decrease in sensitivity.

Another direction which this recent research has taken focuses on multi-layer transducer structures wherein the piezoelectric device is produced by superposition of a plurality of reversed polarity single layers. The objective is to reduce the electrical mismatch between the piezoelectric impedance and those of the cable so as to minimize reflections at interface. Ringing is therefore shorter and sensitivity is improved. Unfortunately, the construction of such devices is highly difficult and requires large quantity production in order to be cost effective.

Still other techniques for broadening transducer bandwidth concern the use of a ceramic of non-uniform thickness. These techniques involve the provision of piezoelectric devices shaped to provide gradient thickness along the elevation dimension thereof so as to afford frequency and bandwidth control of the elevation aperture size and position, as well as the elevation focal depth. Transducers employing these techniques are described, for example, in the following U.S. Pat. No. 3,833,825 to Haan; U.S. Pat. Nos. 3,470,394 and 3,939,467 both to Cook; U.S. Pat. No. 4,478,085 to Sasaki; U.S. Pat. No. 6,057,632 to Ustuner; U.S. Pat. No. 5,025,790 to Dias; and U.S. Pat. No. 5,743,855 to Hanafy.

Briefly considering these patents, in the Haan patent, a thickness-mode transducer is provided which comprises an active body having non-parallel major surfaces for transmitting or receiving energy. The major surfaces of transducer are planar so that the transducer device provides a continuous variation in the resonance frequency from one edge thereof to the other.

The transducers as described in the Cook patents are of a serrated or even double serrated construction and have major opposite surfaces formed at an angle (the '467 patent). Further, the transducer front face may be of convex or concave shape.

The Sasaki patent describes transducers having an element thickness which increases from the central portion toward both edges in elevation direction. However, the variation in thickness described herein is only of two types: continuous and stepwise. The purpose of the thickness variation described in this patent is to control the acoustic radiating pattern of transducer, and neither the manufacturing method used nor the actual transducer construction are fully addressed.

Similarly, the Dias patent discloses a variable frequency transducer wherein the piezoelectric member has a gradient thickness between the center thereof and the outermost ends. Each portion has a particular thickness corresponding to a desired frequency. As a consequence, the transducer provides discrete frequencies and the frequency characteristics are not compatible with the smooth bandwidth shape required by imaging transducers.

In the transducers disclosed in the Ustuner patent, the spacing of elements increases from the first end to the second end so that the dimensions of the overall transducer array tend to be those of a trapezoidal, thereby inherently limiting the number of elements in the array.

In the Hanafy patent, a gradient transducer is produced by grinding a thicker ceramic plate to provide the desired curvature, using a numerically controlled machine. However, machining a curved surface, and especially a cylindrical surface with perfect alignment relative to the ceramic edges has been found to be a particularly delicate operation which requires superior precision with respect to the tooling used and the process employed. Thus, fabrication method described in the Hanafy patent is difficult to carry out in practice. Moreover, if the machined surface profile must be mounted on or another piece of equipment for polishing or grounding (as in the case of a high frequency transducer), the operation can be very time consuming because the necessary positioning of the piezoelectric member requires additional tooling and control of the interfitting of the surfaces involved. Further, the Hanafy patent largely relates to gradient thickness transducers which have been described in other patents and which do not address the problems associated with the prior art manufacturing processes and associated machining requirements.

SUMMARY OF THE INVENTION

In accordance with the invention, a multi-frequency transducer is provided which overcomes or reduces the various drawbacks and disadvantages encountered in the prior art, including that represented by the above discussed patents. More particularly, the present invention relates to ceramic-polymer composite transducers and to new manufacturing methods for making such transducers, these methods being applicable whatever the geometry and shape of the particular transducer involved.

In general, three techniques or approaches are provided in accordance with the invention to broaden transducer bandwidth. In a first approach or aspect of the invention, grinding of piezoelectric composite member is provided to produce a graded thickness. Preferably, the resonance frequency of the resultant transducer decreases from the central portion to the outermost portion of the transducer. However, it will be understood that the method of the invention is not limited to this embodiment, and the method can be used to provide any desired variation in the thickness of the composite member and any ratio between thinnest and thickest portions thereof, according to the bandwidth required.

In accordance with a further aspect of the invention, a composite member is provided wherein the longitudinal velocity thereof varies from the center portion to the outermost portion of the composite of the composite member so that the resonance frequency thereof, which is a function of the longitudinal velocity, will vary proportionally.

A third aspect of the invention relates to a combination of the first two aspects mentioned above wherein a judicious compromise is arrived at to optimize the performance of the transducer as well as the manufacturing process used to make the transducer.

According to the first aspect of the invention, there is provided a manufacturing method for making a composite ultrasonic transducer so that the composite member has a curved or bent shape, this method comprising: forming (or thermo-forming) a composite member on a non-planar tooling device, firmly maintaining the composite member on the tooling device, grinding the upper surface of composite until an upper planar area is produced, metallizing the major surfaces of the composite member and completing construction of the transducer by affixing backing and matching layers as well as suitable connections.

The planar area obtained by grinding need necessarily not cover the entire surface of composite member at which grinding is carried out and the composite member may be formed in a concave or convex shape without changing the basic manufacturing process.

The forming or deformation of the composite member may also be performed on a surface having a three-dimensional curvature so a thickness variation is effected in both azimuthal and elevational planes.

Moreover, the curved surface is not necessarily of a spherical shape. In this regard, the shape of the surface may have a progressive curvature, an ellipsoid shape or a combination of curvature and sloping planes or the like.

As the resonance frequency of transducer changes shape, the matching layer or layers must be determined accordingly, so as to ensure that the thickness of matching layer or layers varies inversely with the frequency of transducer. The manufacturing process used in obtaining such a matching layer or layers is preferably similar to that used in making the composite member itself.

In a further preferred embodiment, the composite member is of regular thickness and the longitudinal sound velocity varies in the elevational plane, preferably from the center to the outermost end, but also from one end to the other end. In a preferred implementation, the composite member is ceramic ratio shifted, i.e., the longitudinal velocity is controlled by controlling the volume ratio of the ceramic material to the piezoelectric polymer material. In one advantageous embodiment, the ceramic ratio is higher at the center of transducer than the edges. Because the sound velocity in the ceramic material is typically twice that in polymer, a variation of the ratio of ceramic to the polymer will strongly affect the overall velocity in the composite member.

As indicated above, a third aspect of the invention involves a combination of the grinding technique or operation discussed hereinbefore with shifted velocity composite approach. The result is a smoothing of composite curvature in maintaining the enhancement of bandwidth previously mentioned. It should be noted that providing shifted behavior in a transducer presents difficulties and is more expensive than standard methods so that a judicious compromise should be made based on the geometrical specifications and requirements of the particular transducer being made.

Further features and advantages of the present invention will be set forth in, or apparent from, the detailed description of preferred embodiments thereof which follows.

DESCRIPTION OF THE PREFERRED EMBODIMENTS

According to a first preferred embodiment, there are provided various methods of manufacturing transducers so as to obtain broad bandwidth and/or acoustic radiation control and, in particular, methods for making "conformable" transducers such as those comprising a composite or polymer, particularly for use in medical imaging. The term "conformable" is used herein to describe a family of devices which are characterized as being capable of being bent, curved or shaped so as to assume forms other than planar. The term "composite" as used herein relates to vibrating material which is achievable by embedding a piezoelectric material into a polymer matrix or by mixing together at least two materials, one non-piezoelectric and the other piezoelectric.

Figure 1B:
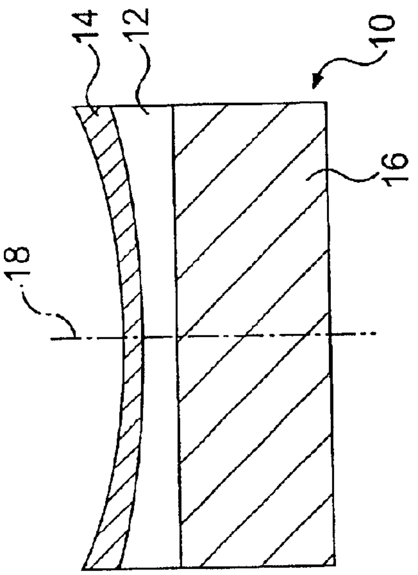
FIGS. 1*a*, 1*b* and 1*c* are all cross-sectional views of graded frequency transducers in accordance with different preferred embodiments of the invention.
Figure 1A:
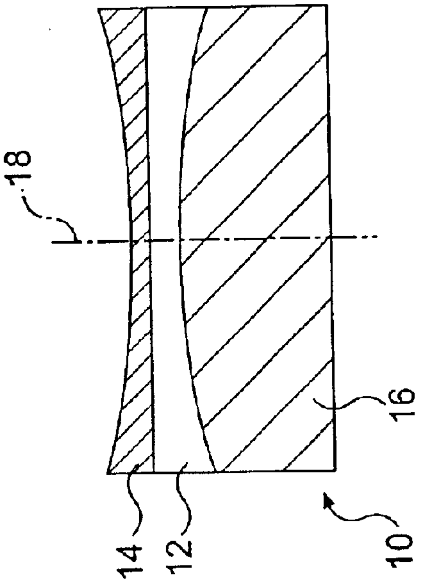
Figure 1C:
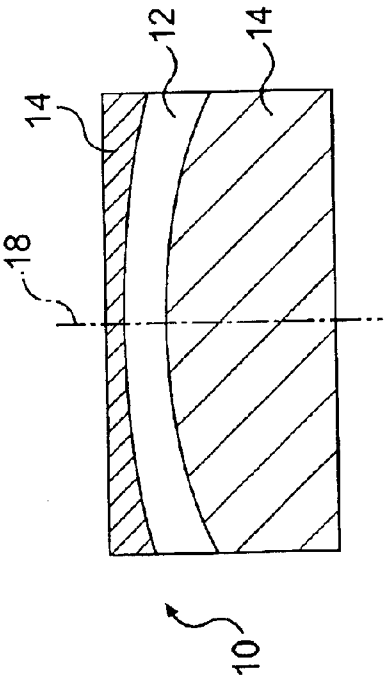

Referring to FIGS. 1*a*, 1*b* and 1*c*, three different embodiments of a gradient resonance transducer are provided wherein like elements are given the same reference numbers throughout the figures. The cross-sectional view of FIG. 1*a* illustrates the principle of a graded thickness composite, and shows a composite transducer device 10 including a piezoelectric composite plate or layer 12 disposed between at least one matching layer 14 and a backing layer 16. In this embodiment, the device 10 has an external concave surface and a flat interface between composite 12 and matching layer 16.

In FIG. 1*b*, the composite has a flat bottom surface and a curved upper or front adjacent matching layer surface.

In FIG. 1*c* the device 10 has a flat external transducer surface and the curved surfaces of composites are internally sandwiched between the backing layer 16 and matching adjacent surfaces of layer 14.

Basically, the transducers 10 in FIGS. 1*a*, 1*b* and 1*c* are constructed by adding the backing member 16 to the lower or back surface of the piezoelectric composite plate 12 and adding one or more matching layers 14 on the front surface thereof, and the ultrasonic devices obtained are of the configurations described above. More particularly, in FIG. 1*a*, the flat top surface of composite 12 is affixed or attached to the matching layer 14 which has a slightly concave front surface. In FIG. 1*b*, matching layer 14 has a stronger concave external surface and is deposited on a concave top surface of the composite 12. In FIG. 1*c*, a planar external transducer surface is obtained by the combination of convex composite top surface and internal matching layer concave surface.

In all embodiments, matching layer 14 is assembled or affixed to the front surface of the composite 12 by bonding or molding process. To perfectly match the transducer frequency at any point along this surface, the thickness of the matching layer 14 has a cross-sectional profile similar to that of the corresponding composite piezoelectric layer or plate 12. In FIGS. 1*a* to 1*c* the cross section of transducer 10 has an axis of symmetry 18 passing through the center of transducer device 10 and perpendicular to the external transducer surface. This configuration is governed by a preference in these embodiments for an orthogonal acoustic radiating pattern; however, if the acoustic path is to be inclined or steered from the surface of transducer, the cross-sectional profile of composite 12 and matching layer 14 will then have an axis of symmetry oriented accordingly.

Figure 2A:
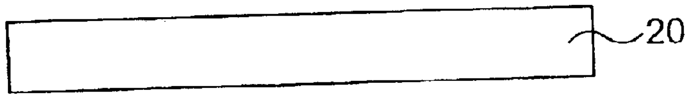
FIGS. 2*a* to 2*g* are cross-sectional views depicting steps in a preferred embodiment of a manufacturing method for a gradient frequency transducer in accordance with another preferred embodiment of the invention.
Figure 2B:
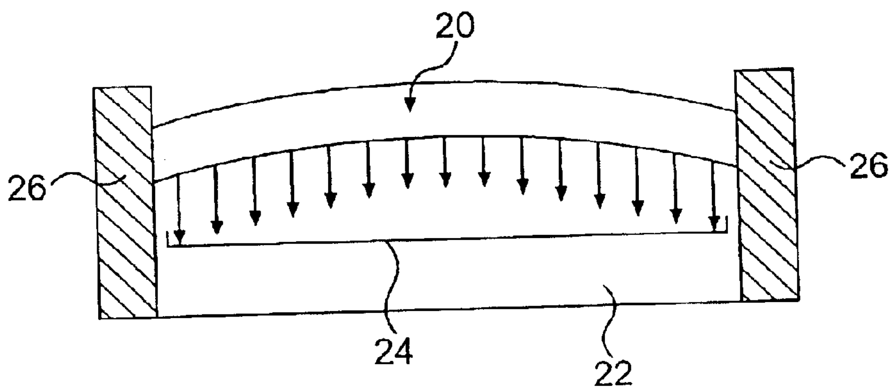

Referring to FIGS. 2*a* to 2*g*, there are shown the steps of the manufacturing method for a broadband composite transducer in accordance with the invention. In FIG. 2*a*, a planar, uniformly thick composite plate 20 is shown. The thickness of the raw composite is chosen to be thicker than that of the final transducer. In FIG. 2*a*, the composite 20 is deformed so as to be cylindrically or spherically shaped, and a tooling device 22 is provided which comprises a lattice or array 24 of micro-holes provided in the top surface thereof. These micro-holes are connected to or otherwise in communication with a vacuum pump (not shown) that is used to retain the composite in place after the deformation operation. The composite 20 is guided in the tooling device 20 by lateral guide plates or walls 26 in case of a linear array or by a corresponding guiding ring or annulus in the case of a circular array or lattice.

The composite 20 is preferably bent or shaped under elevated temperature conditions in that this will relax the material prior to forming and prevent cracking in the composite structure. In an advantageous embodiment, the temperature used is in the range of 60 to 80° C. In order to thermally shape the composite, the tooling device 22 and composite 20 are separately heated so as to reach the predetermined temperature (for instance, 80° C.). Then, the composite 20 is adjusted on the tooling surface and pressure is exerted on the surface of composite 20, preferably using a flexible, complementary pusher (not shown). Once the composite bottom surface fits perfectly the upper tooling surface, a vacuum is provided through micro-holes of micro-hole array 24 to maintain the composite 20 in place even after the pressure is released. The temperature is then progressively decreased to ambient so the internal constraints within the composite 20 are retained and the composite member is then capable of maintaining the imposed curvature. In practice, significant time is necessary to complete this operation and thus the composite 20 must be maintained under pressure and vacuum until the temperature of the composite drops to the ambient temperature. This condition is maintained during a complementary period which may require several hours depending on the nature of composite and the degree of bending being applied to composite.

Figure 2C:
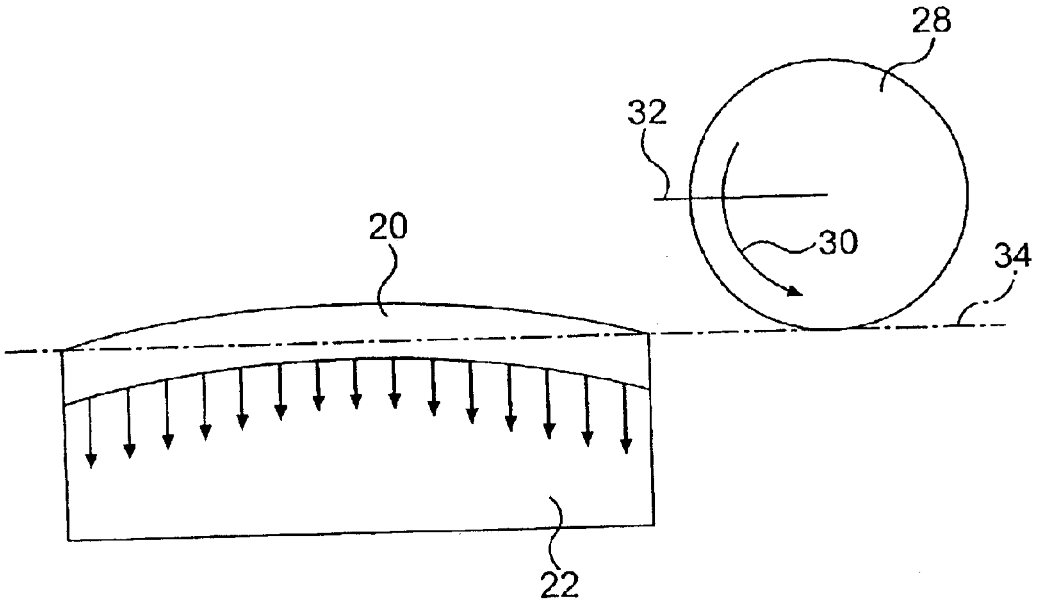

Turning to the next step, FIG. 2*c* shows the composite member 20 and the tooling device 20 without lateral guidance walls or plates 26. However, it is to be understood that the composite 20 is firmly maintained on tooling device 22 by the vacuum force exerted on the interface therebetween. In this next step, a planar grinding operation is then performed on the top surface of composite 20 by using a grinding tool 28. The grinding tool 28 is carried to undergo rotation, as indicated by arrow 30 and linear displacement, as indicated by arrow 32. In FIG. 2*c*, the dashed line 34 indicates the grinding depth or limit, i.e., grinding the composite 20 down to dashed line 34 results in the composite 20 having a graded thickness from the center to the edges according to that shown in FIG. 2*c*. In general, the composite member 20 is composed of ceramic or crystal pillars embedded into a resin or polymer matrix (as described in more detail below in connection with FIGS. 5 and 6) and therefore, the composite member 20 is hard enough to machine. Thus, grinding tool 28 is preferably some form of diamond powder embedded tool. Although the drawing does not show this, the grinding depth limit 34 is determined according to the desired frequency excursion of the resultant transducer so that grinding can be carried out over the entire surface of the composite 20 or only partially. In the latter case, the resultant transducer will only be frequency graded in the portion thereof that is machined and the remaining portion will operate at a discrete frequency.

Figures 2D, 2E, 2F, 2G:
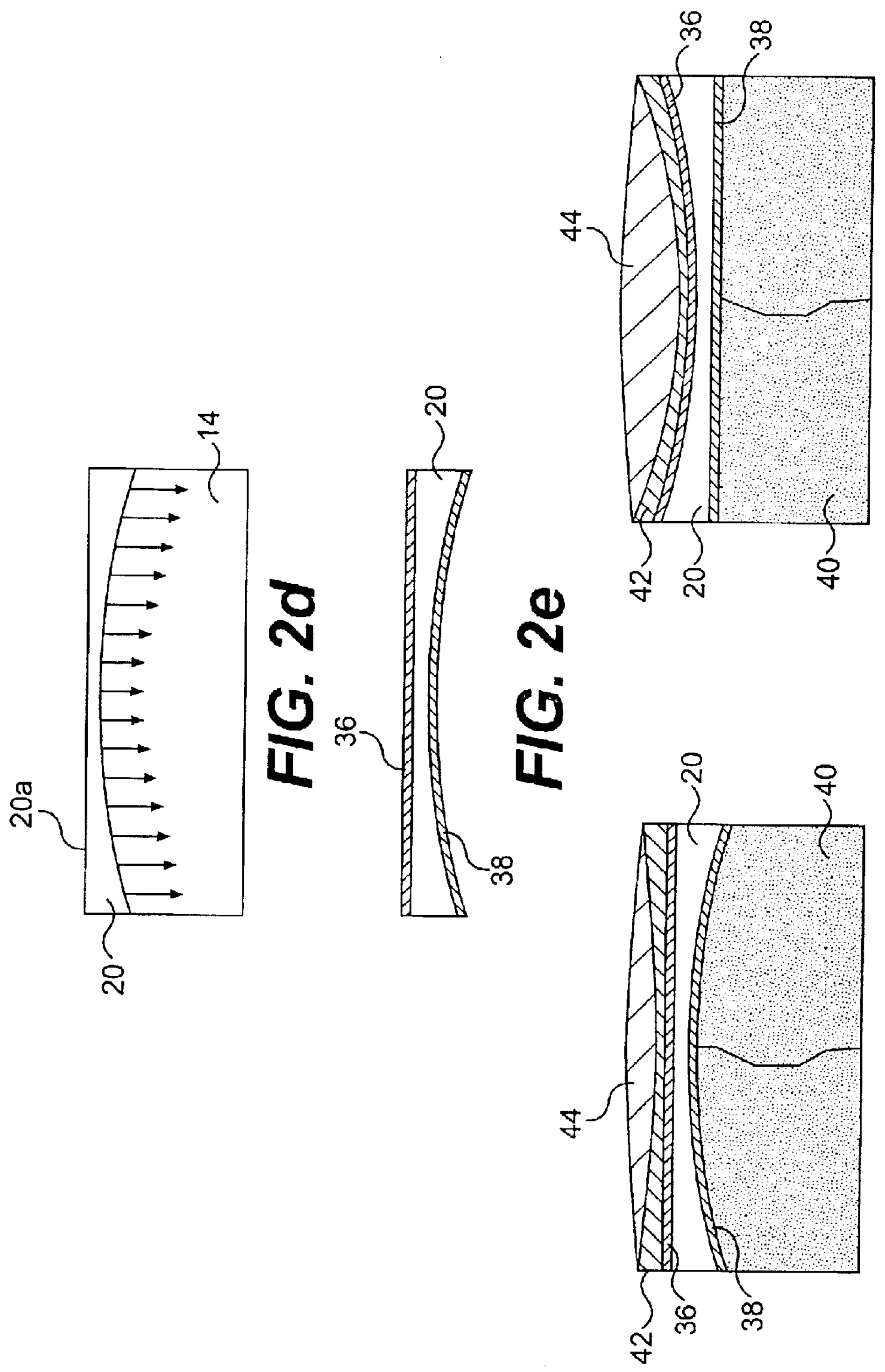

Upon completion of the grinding operation shown in FIG. 2*c*, the composite member 20 is as shown in FIG. 2*d*, mounted on tooling device 22 and includes a flat top surface obtained from the previous grinding operation.

In the next step, the composite member 20 is then plated on its major surfaces to form electrodes 36 and 38 as shown in FIG. 2*e*. This operation can be performed using several methods such as sputtering, vacuum evaporation, chemical or painting. The electrode plating process used should be determined with respect to the desired frequency responses and environmental condition of transducer. In this regard, re-heating of composite 20 must be strictly avoided so as to not release the internal retaining constraints that retain composite 20 in its bent or curved shape. However, if re-heating is necessary, an additional operation to provide re-shaping of the composite 20 can still be carried out without damage to the composite material by repeating the deformation process previously described.

Referring to FIG. 2*f*, there is shown a complete transducer in a cross-sectional view, wherein the composite member 20 is sandwiched between a backing layer or member 40 and one or more matching layers 42. In this embodiment, the transducer construction includes a flat top surface composite 20 as well as a silicon lens which can be provided to focus the acoustic pattern. As illustrated, the silicon lens 44 has a thicker portion at the center of transducer and the sound velocity in the silicon material of lens 44 must then be lower than those of the tissue being imaged.

A similar transducer using a graded frequency composite is shown in FIG. 2*g*, where the composite 20 has its top concave surface oriented in a direction toward the acoustic path. The transducer construction is otherwise similar to that of FIG. 2*f*, but with the curvature of the matching layer surface being shaped accordingly, and the silicon lens profile thus differing from that of FIG. 2*f*. It will be understood that as the curvature of the transducer front surface is increased, the radiation of acoustic waves from this surface is inherently more focussed. Further, if curvature of composite 20 of FIG. 2*d* is ideally defined, the resultant transducer can have the desired focal characteristics without the use of the silicon lens, and such a construction is preferably in cases where sensitivity is critical or important.

Referring to FIGS. 3*a* to 3*h*, there are shown some of the variations in the cross-sectional shape of the composite which are covered by the present invention. In all of these figures the composite is denoted 50. Further, all of the embodiments are shown having a central symmetry of axis for purposes of simplicity, it being understood, however, that the axis of symmetry can be positioned anywhere in the cross section of transducer without any change in the basic design principles and manufacturing method.

Figure 3A:
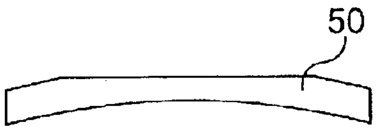
FIGS. 3*a* to 3*h* are side elevational views of composite sections in accordance with different embodiments of the invention.

FIG. 3*a* depicts a composite shape wherein the composite 50 has a bent or curved bottom surface obtained by deformation. The top surface of the composite has been subjected to partial planar grinding so there is a remaining surrounding area where the frequency is constant.

Figure 3B:
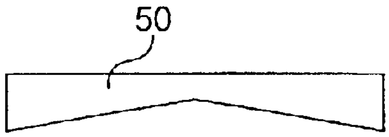

In FIG. 3*b*, the composite 50 is shaped in the fashion of a roof, with the top surface of the composite 50 being ground down to provide a planar area throughout the top surface so the transducer obtained has a frequency which increases from the edges to the center of composite 50.

Figure 3C:
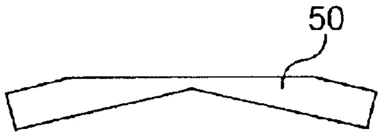

The embodiment of FIG. 3*c* is similar to that of FIG. 3*b* with the exception that the planar area does not cover the entire top surface of composite 50 so the transducer obtained has a graded frequency at the central portion thereof and a surrounding constant frequency portion.

Figure 3D:
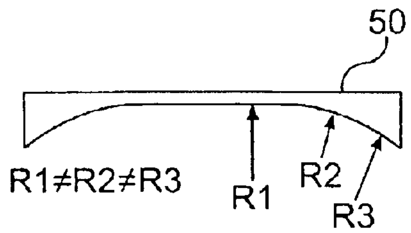

The composite sectional shape shown in FIG. 3*d* has a curved bottom surface formed by at least two and, in the illustrated embodiment, three, different curves each having a respective radius of curvature indicated by r1, r2, r3, where r1, r2 and r3 are different. This technique of curving or bending the composite surface enables side lobe reduction. Otherwise, the top surface remains planar and the transducer shape is generally as shown in FIG. 3*a*.

Figure 3E:
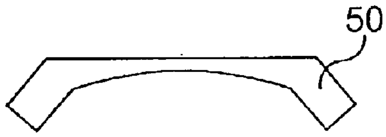

In accordance with another aspect of the invention, a composite cross-sectional shape is provided which, as shown in FIG. 3*e*, is composed of a first central portion having curved or bent bottom surface associated with planar top surface, and a second portion having constant thickness which surrounds the graded frequency first portion. The surrounding portions can be inclined so as to be of a conical section shape or other curved shape.

Figure 3F:
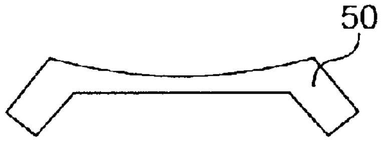

FIG. 3*f* depicts a particular composite cross section shape that is a variation of that shown in FIG. 3*e* described above. The composite 50 depicted in FIG. 3*f* is obtained from that of FIG. 3*e* with an additional forwardly applied deformation. As the result, the transducer illustrated is geometrically focused by the shaping of its front surface and therefore, no lens is needed. Such a transducer is useful for "END" applications wherein the surrounding conical portion is used in radiating transverse or Rayleigh waves, while longitudinal waves are radiated by the central curved portion. The combination of these two types of waves is capable of being used to detect and quantify a large quantity of defaults or cracks in a test material.

Figure 3G:
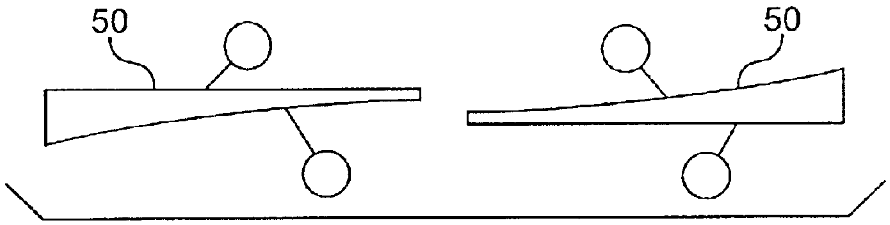
Figure 3H:
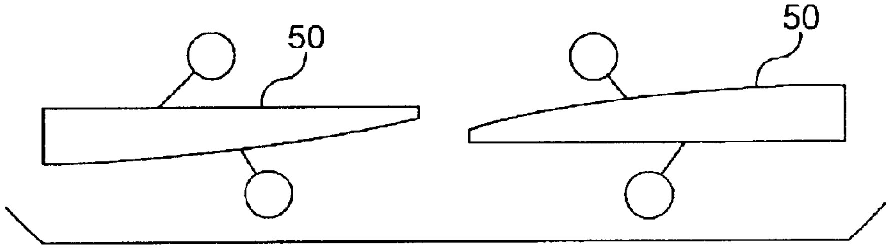

In FIGS. 3*g* and 3*h*, the composite member 50 is shaped into graded thickness sections wherein the first major surface remains flat and the second major surface is of a convex or concave shape. The advantage of such a configuration is the non-linear variation of the thickness shift which is provided and which can lead to an improvement in the levels of the lateral or side lobes.

Based on the principles discussed above, FIGS. 4*a* to 4*c* relate to transducers which provide shifting of the resonance frequency in at least two perpendicular planes. Such transducers may be useful in families of ultrasonic devices such as single element devices, annular arrays, linear arrays, and 1.5D or 2D arrays. However the technique is particularly advantageous as used in transducers having a surface area shaped in rectangular, square, circular-like or ellipsoid-like configurations, i.e., in configurations where the effects of graded thickness are approximately equally experienced in all different directions of the emitting plane.

Figure 4A:
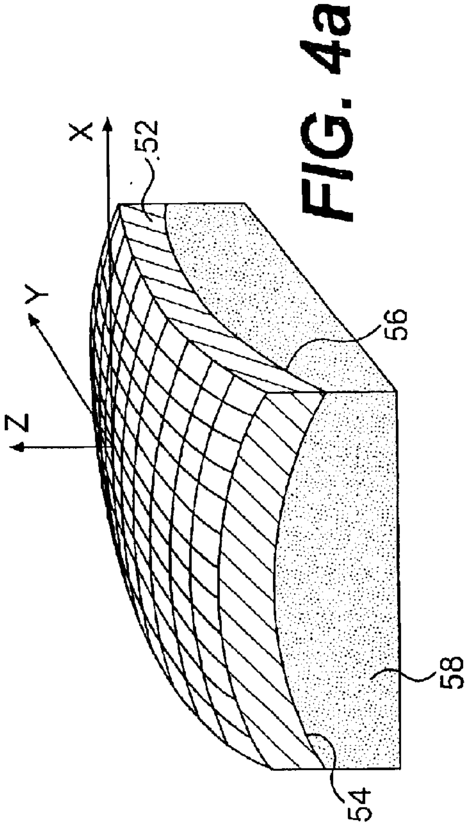
FIGS. 4*a* to 4*c* are perspective views of bi-dimensional frequency graded transducers in accordance with different preferred embodiments of the invention.
Figure 4C:
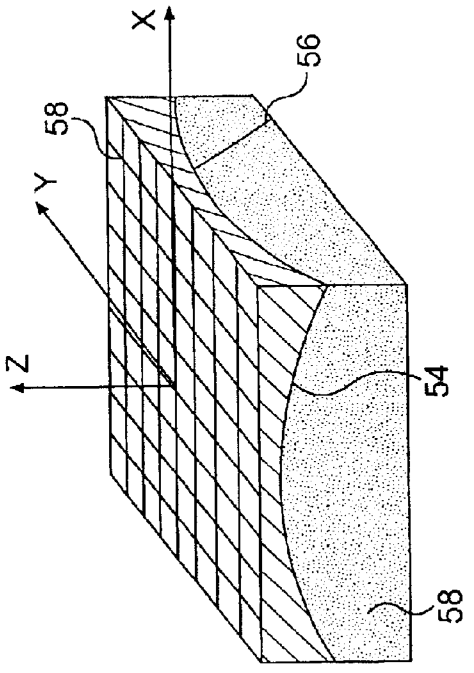
Figure 4B:
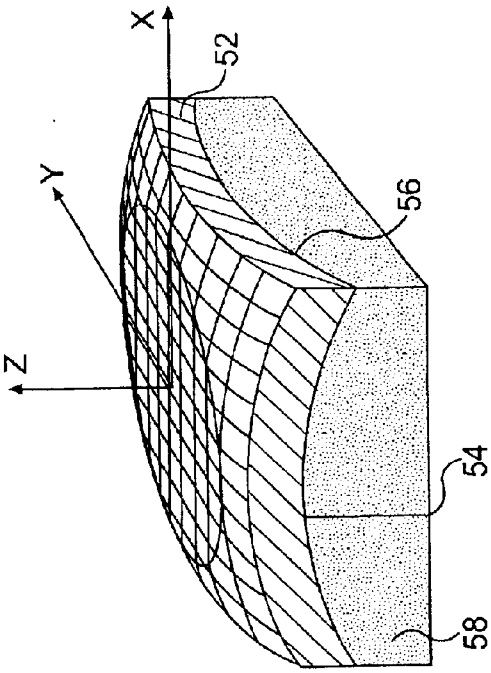
Figure 6A:
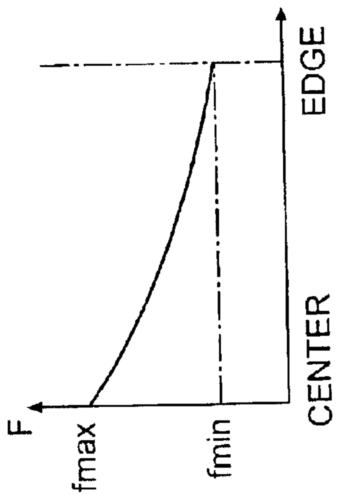
FIG. 6*a* is a graph similar to FIG. 5*a*, used in explanation of the characteristics of the composite of FIG. 6.

As shown in FIG. 4*a*, the composite member 52 is formed so as to have curvatures 54 and 56 that are produced by deformation tooling. Preferably, the intersections of the curvatures or curved surfaces pass through the center of the transducer surface in order to obtain an acoustic pattern radiated perpendicularly from the transducer surface. The manufacturing method used in implementing FIGS. 4*a* to 4*c* is otherwise similar to those previously described. A backing 58 is molded or bonded on the backside or bottom of composite, sandwiching flex interconnection means (not shown). For purposes of simplicity, the matching layer or layers are not shown in FIGS. 4*a* to 4*c* but to one skilled in the art, the existence of matching layer in an imaging transducer construction would be understood, and details of suitable techniques for forming such layers have widely been reported in the literature.

Returning to the method of making the transducer, once the composite 52 is perfectly shaped as shown in FIG. 4*a*, the top surface thereof is planar ground, using conventional grinding techniques, as depicted in the FIGS. 4*b* and 4*c*. It will be seen that the ground region that is shown in FIG. 4*b* is performed within the symmetry of the transducer and that as a result, there are several planes of symmetry. The ground region may be smaller than the overall transducer surface, as shown in FIG. 4*b*, or may entirely cover this surface, as shown in FIG. 4*c*, depending on the required acoustic specifications.

Regarding the implementation of a single element transducer, such an implementation will have, as a result, a broadening of bandwidth associated with an extension of the focal zone. In a linear array, and more particularly, in phased-array transducers, the resultant device is provided with graded frequency elements in both elevational and azimuthal planes. The degree of curvature or bending in the two perpendicular planes is not necessarily identical but may differ to provide the transducer with acoustic behavior according to particular desired specifications. For instance, the scanning plane (azimuth) is obtained by summing individual scanlines exhibiting a progressive frequency shift, and the method here will reduce artifacts due to a monochromatic aperture. In the elevation plane, shifting the frequency of element will increase the bandwidth, and therefore, a combination of two methods will result in a transducer with enhanced bandwidth and side lobes. Perhaps the best application of this aspect of the invention concerns 1.5D and matrix array transducers wherein the above concepts are nearly ideally exploited. In this regard, a matrix array generally comprises a plurality of transducer elements arranged in rows and columns throughout the surface so each scanning plane is achievable by addressing a group (lane) of elements available on transducer surface, and moving this aperture provides the capability of producing 3D images. Because the transducer is constructed with a progressively increasing thickness beginning from the center and extending to the edges, higher frequency transducer elements disposed at the centermost area and lower frequency transducer elements disposed at the outermost area form every scanning plane. This disposition will dramatically improve the image quality provided by the transducer system. As indicated above, the ultrasonic transducer according to FIGS. 4*a* to 4*c*, is applicable to single element ultrasound devices, annular arrays, and linear arrays as well.

Figure 5A:
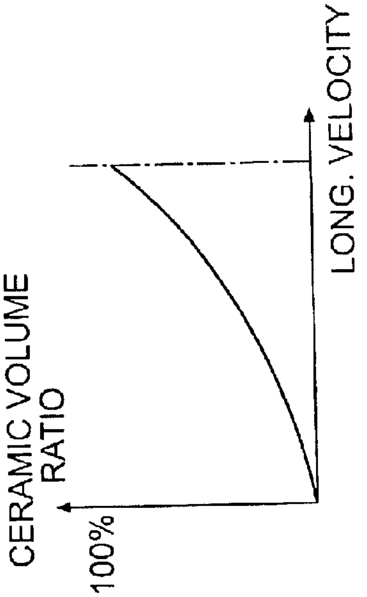
FIG. 5*a* is a graph used in explanation of the characteristics of the composite of FIG. 5.
Figure 5:
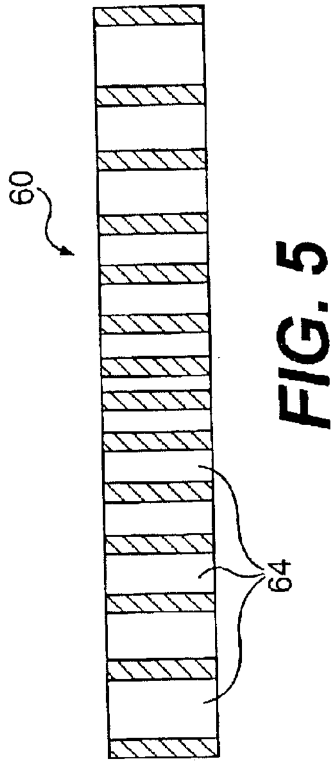
FIG. 5 is a cross-sectional view of a gradient ceramic ratio composite for a broadband transducer in accordance with another preferred embodiment of the invention.
Figure 6:
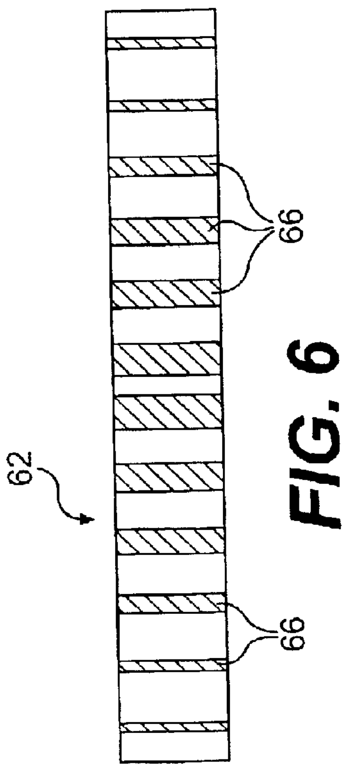
FIG. 6 is a cross-sectional view of a gradient ceramic ratio composite in accordance with yet another embodiment of the invention.

Referring to FIGS. 5 and 6, there is depicted another implementation of grading the frequency of transducers wherein the composite members, which are denoted 60 and 62, respectively, are of constant thickness, but the corresponding structures provide sound velocity shift characteristics from the center to outermost ends. This behavior is achieved either by a variable distribution of identical ceramic pillars 64 in the composite elevation plane (as shown in FIG. 5) or by regularly spacing ceramic pillars 66 having progressively increasing widths (as shown in FIG. 6). Since the relation involving sound velocity governs the resonant frequency of the composite and material thickness (C=2*t*F), transducers employing this type of material are frequency variable and thus able to operate over a wider band. Obviously, using this technique to produce broadband transducers facilitates the overall manufacturing process but makes the composite fabrication more delicate. However, the excursion of the sound velocity is limited by the feasibility of making the composite structure. In this regard, a sound speed variation exceeding 10% is, practically speaking, unrealistic, while a variation preferably up to 5% is reasonable and practical. The other drawback of making a shifting sound velocity composite is that the variation in acoustic impedance of the material is a function of the percentage of ceramic in the structure so that defining the required matching layers for such transducers can be difficult.

Figure 7:
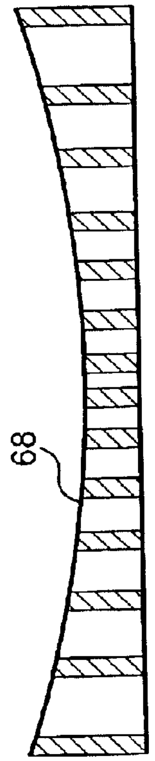
FIG. 7 is a cross-sectional view of a gradient ceramic ratio composite with a graded thickness, in accordance with a further preferred embodiment of the invention.

Based on these considerations, a judicious compromise may be made by combining shifted sound velocity composite concepts and ground surface, graded thickness composite concepts. In this regard, FIG. 7 shows a composite member 68 incorporating both sound velocity techniques and graded thickness techniques provided with respect to the top surface thereof. The composite according to this aspect of the invention will exhibit a smoother curvature surface in comparison with an equivalent regular composite of the type discussed previously. It is noted that the grinding operation on composite member 68 according to FIG. 7 is performed as described in detail above in connection with FIGS. 2*a* to 2*f*.

Although the invention has been described above in relation to preferred embodiments thereof, it will be understood by those skilled in the art that variations and modifications can be effected in these preferred embodiments without departing from the scope and spirit of the invention.

What is claimed:

1. An ultrasonic transducer comprising a transducer body having a major front surface for radiating ultrasonic energy to a propagation medium, said transducer comprising a piezoelectric member having a curved shape including a curved major surface, and said transducer including a graded frequency region of continuously varying thickness located at the curved major surface of the piezoelectric element and defined by an area of intersection of a grinding plane and said major curved surface of the curved piezoelectric member so that the transducer can be operated at a continuous graded frequency.

2. An ultrasonic transducer according to claim 1 wherein the piezoelectric component comprises a composite material comprising a ceramic embedded in polymer matrix.

3. An ultrasonic transducer according to claim 1 wherein the transducer comprises a single element transducer.

4. An ultrasonic transducer according to claim 1 wherein the piezoelectric member has a total major surface, and the area of intersection between the grinding plane and the major surface of piezoelectric member is less than the total major surface of the piezoelectric member.

5. An ultrasonic transducer according to claim 1 wherein the piezoelectric member has a total major front surface, and the area of intersection between the grinding plane and the major front surface of piezoelectric member corresponds to the total major front surface of the piezoelectric member.

6. An ultrasonic broadband composite transducer having graded frequency characteristics, said transducer comprising:

a composite member composed of vertical ceramic pillars distributed with progressively increasing spacing therebetween, as viewed in side elevation between the center of composite member and the outermost edge thereof, so that the longitudinal velocity characteristics of the transducer are shifted an amount proportional to the ceramic volume ratio of the composite member.

7. A method for manufacturing frequency graded ultrasonic transducers according to claim 6 wherein at least one major face of the composite member is curved so that the composite member has a graded thickness.

8. A method for manufacturing frequency graded ultrasonic transducers according to claim 6 wherein the widths of the ceramic pillars decrease between the center of transducer and the outermost edge.

* * * * *